(12) United States Patent
Le et al.

(10) Patent No.: US 6,226,219 B1
(45) Date of Patent: May 1, 2001

(54) SEMICONDUCTOR MEMORY WITH A PLURALITY OF MEMORY BANKS

(75) Inventors: Thoai-Thai Le; Andrea Trunk, both of München; Karl-Peter Pfefferl, Höhenkirchen-Siegertsbrunn, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/549,275

(22) Filed: Apr. 14, 2000

(30) Foreign Application Priority Data

Apr. 14, 1999  (DE) .............................. 199 16 913

(51) Int. Cl.$^7$ .................................................. G11C 8/00
(52) U.S. Cl. ................... 365/230.06; 365/230.03
(58) Field of Search ................. 365/230.06, 230.03, 365/230.08

(56) References Cited

U.S. PATENT DOCUMENTS

| 5,327,380 | * | 7/1994 | Kersh, III et al. | 365/195 |
|---|---|---|---|---|
| 5,357,478 | | 10/1994 | Kikuda et al. | 365/230.03 |
| 5,742,554 | * | 4/1998 | Fujioka | 365/222 |
| 5,774,409 | * | 6/1998 | Yamazaki et al. | 365/230.03 |
| 5,844,857 | * | 12/1998 | Son et al. | 365/230.06 |
| 5,930,194 | * | 7/1999 | Yamagata et al. | 365/230.03 |
| 5,940,342 | * | 8/1999 | Yamazaki et al. | 365/230.03 |
| 5,995,415 | * | 11/1999 | Kuo et al. | 365/185.11 |

OTHER PUBLICATIONS

"Mikroprozessortechnik", Helmut Müller et al., Vogel Buchverlag Würzburg, 2$^{nd}$ edition, 1989, pp. 44–45 month unavailable.

* cited by examiner

Primary Examiner—Son T. Dinh
Assistant Examiner—Anh Phung
(74) Attorney, Agent, or Firm—Herbert L. Lerner; Laurence A. Greenberg; Werner H. Stemer

(57) ABSTRACT

The memory banks of semiconductor memories are activated via memory bank decoders. Two groups of memory banks are actuated via identical memory bank decoders. A predecoder is used to switch between the memory bank decoders. The layout of a memory bank decoder in a memory with a smaller memory capacity can thus be transferred without a change to a memory with a greater memory capacity.

7 Claims, 2 Drawing Sheets

SEMICONDUCTOR MEMORY WITH A PLURALITY OF MEMORY BANKS

BACKGROUND OF THE INVENTION

FIELD OF THE INVENTION

The invention lies in the semiconductor technology field. More specifically, the invention relates to a semiconductor memory with memory banks, which can be selected by associated memory bank decoders.

Memory cells in semiconductor memories are arranged in matrix form, that is to say in rows and columns. Address decoders are in each case provided for rows and columns, and allow one of the rows or columns to be selected. Normally, the memory cells are activated in rows via word lines by switching on access transistors via which in each case one capacitor is accessed, in which the information in the memory cell is stored. The line path of the transistors is connected in columns to bit lines via which the information in a memory cell can be read, after having been amplified with a read amplifier. Access for writing information to be stored to a memory cell takes place in a corresponding manner.

In very modern semiconductor memories using dynamic memory cells (DRAMs), the memory cell array has a bank architecture.

A memory bank contains all those functional units which are required to carry out a memory access autonomously. A memory bank is thus assigned respective row and column address decoders, together with read amplifiers and other functional units required for operation of the semiconductor memory, for example time control circuits, redundancy circuits etc. If necessary, functional units in different memory banks may be used jointly, for example read amplifiers or bit line or column decoders.

A memory bank and the functional units associated with it are activated by memory bank decoders. When access to a specific memory cell in a memory bank is intended, the functional units associated with the memory bank are switched from a waiting state or standby to an activated state. The actuation process is brought about by a memory bank decoder output signal associated with that memory bank. Each memory bank has a unique memory bank address assigned to it. When the address is applied to the memory bank decoder, the output signal of the latter associated with the memory bank is activated.

As the number of memory banks increases, the memory bank decoders become more complex. By way of example, a DRAM with a memory capacity of 64 Mbits comprises 16 memory banks, and a DRAM with 128 Mbits and a corresponding architecture comprises 32 memory banks.

SUMMARY OF THE INVENTION

The object of the invention is to provide a semiconductor memory with memory banks which overcomes the above-noted deficiencies and disadvantages of the prior art devices and methods of this kind, and in which the design complexity required for the memory bank decoders is low.

With the above and other objects in view there is provided, in accordance with the invention, a semiconductor memory, comprising:

a plurality of memory banks divisible into a first group of memory banks and a second group of memory banks, each of the memory banks including
a memory cell field in which a multiplicity of memory cells are arranged in a matrix;
an address decoder connected to the memory cells for selecting a row in the matrix of memory cells; input devices for supplying an address with a number of address bits and defining a selection of a respective row in one of the memory cells by actuating the address decoder;

a first memory bank decoder having an input side connected to receive a first portion of the address bits and a first enable signal, and an output side connected to the first group of memory banks, the first memory bank decoder outputting a respective bank selection signal for each the memory bank in the first group, for selecting one of the memory banks in the first group;

a second memory bank decoder constructed substantially identically to the first memory bank decoder and connected to the second group of memory banks, the second memory bank decoder having an input side connected to receive the first portion of the address bits and a second enable signal, and an output side outputting a respective bank selection signal for each the memory bank in the second group, for selecting on of the memory banks in the second group; and a predecoder having a logic circuit, an input side connected to receive a second portion of the address bits and a further enable signal, and an output side outputting the first and second enable signals as mutually complementary signals.

In accordance with an added feature of the invention, the memory bank decoders each include a memory bank decoder element for each associated memory bank, each the memory bank decoder element having an input side connected to receive the first portion of the address bits and the respective enable signal.

In accordance with an additional feature of the invention, the predecoder includes logic gate elements each having an output outputting the complementary enable signals, and an input connected to receive the further enable signal and complementary signals of the second portion of the address bits.

In accordance with another feature of the invention, the memory banks are activatable and deactivatable by the bank selection signal output by the address decoders.

In accordance with a further feature of the invention, the address decoders are connected to receive a third portion of the address bits, and the address bits in the third portion of the address bits are identical for all the memory banks.

In accordance with an advantageous embodiment of the invention, the plurality of memory banks are $2^m$ different memory banks, the first portion of the address bits has n different address bits, the second portion of the address bits has m−n different address bits, the first and second memory bank decoders are included in a number $2^{m-n}$ of memory bank decoders each having $2^n$ memory bank decoder elements, an output signal of a respective the memory bank decoder element of one of the memory bank decoders is activated when one specific combination of $2^n$ possible combinations of states of the address bits input to the respective the memory bank decoder occurs, each of the memory bank decoder elements in a given the memory bank decoder is activatable by a different combination, and m and n are integers.

In accordance with a concomitant feature of the invention, the memory banks associated with one of the first and second memory bank decoders are disposed immediately adjacent one another.

In summary, a number of identical memory bank decoders are arranged in a semiconductor memory according to the invention. A predecoder is used to switch between these memory bank decoders. The layout of an individual memory bank decoder is known from a memory generation with a smaller memory capacity. This is transferred to the following design of a semiconductor memory having a higher capacity. If need be, the layout can automatically be restricted to a lower structure width of the production process. The additional design complexity occurs in the design of the predecoder, to the input side of which the address signals which are additionally necessitated by the greater memory capacity are supplied.

Other features which are considered as characteristic for the invention are set forth in the appended claims.

Although the invention is illustrated and described herein as embodied in a semiconductor memory having memory banks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Description of the Preferred Embodiments

Figure 1:
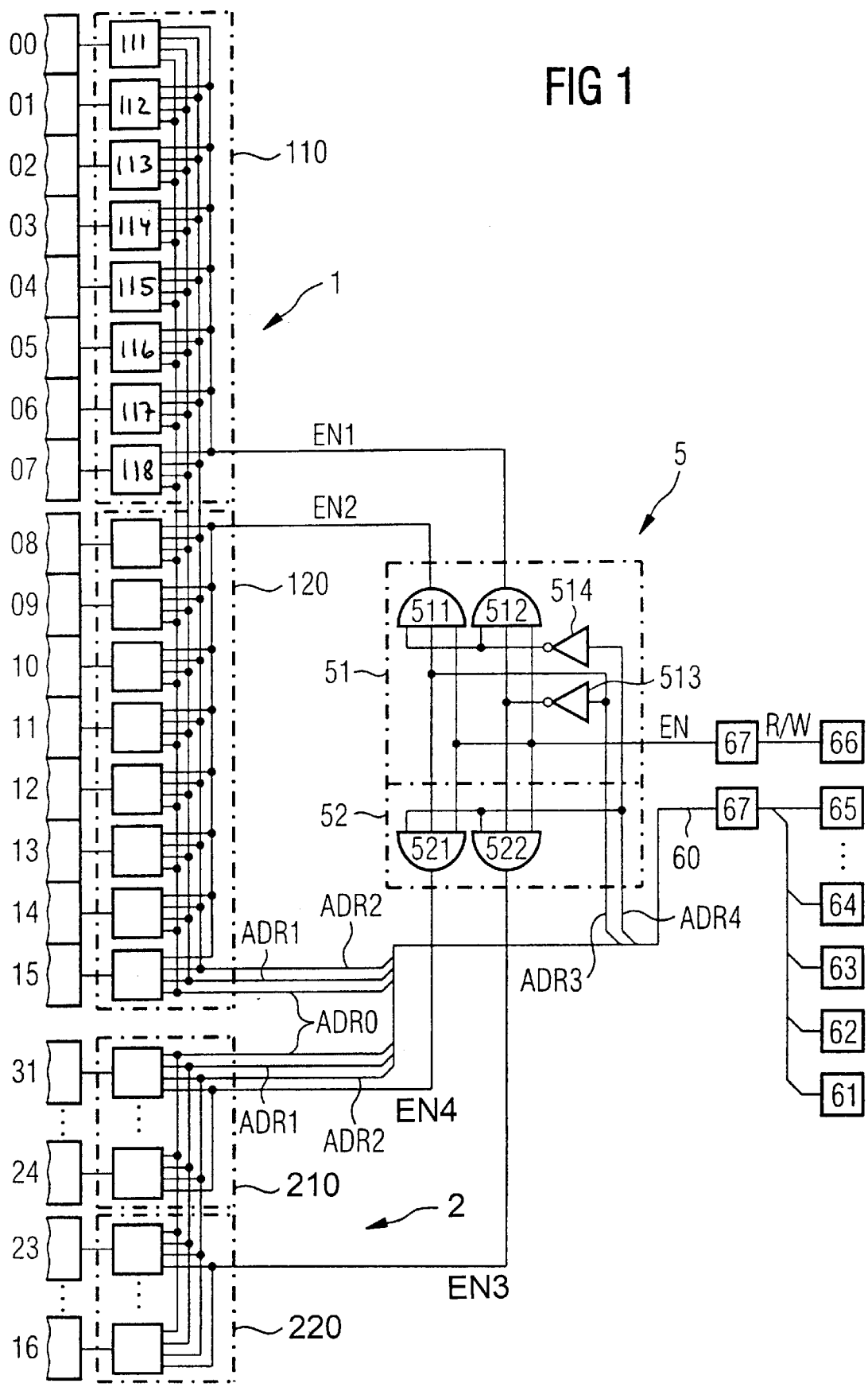
FIG. 1 is a diagrammatic view of a semiconductor memory with 32 memory banks.

Referring now to the figures of the drawing in detail and first, particularly, to FIG. 1 thereof, there is seen a exemplary semiconductor memory, namely a DRAM with a memory capacity of 128 Mbits. The memory contains 32 memory banks, which are arranged in two blocks 1 and 2 of 16 banks each. The memory banks 1 can be actuated independently of one another, with respect to the memory banks 2. A predecoder 5 with decoder elements 51, 52 is used for switching. A memory word can be selected by means of an address which is entered via a number of external connections of the semiconductor chip. The external connections are so-called pads. A memory word comprises one or more memory cells, which can be addressed jointly. This is the smallest addressable unit in the memory cell field. Address pads 61, . . . , 65 are provided for entering the address. After buffer storage, and after decoding 67 in the case of a packet protocol, the address is available inside the chip as a number of address bits on an address bus 60. The address signals are distributed on the chip to the respective functional units via the address bus 60. Furthermore, an enable signal EN is present inside the chip. The enable signal indicates that the address is valid for addressing the rows of the memory cell field, and thus initiates a memory access.

The first block 1 of memory banks comprises 16 memory banks 00, . . . , 15. The memory banks 00, . . . , 07 form a first group of eight memory banks, and are actuated by a first memory bank decoder 110. The memory banks 08, . . . , 15 form a second group of eight memory banks, and are actuated by a memory bank decoder 120. The memory bank decoders 110, 120 have an identical circuit layout. This means that those structures on the semiconductor chip which form the decoders 110, 120 are identical to one another. One of the decoders is in this case already known from the circuit layout of a semiconductor memory having a smaller memory capacity, for example a 64 Mbit DRAM. The layout is transferred, with regard to the relative position of the structural elements; if need be, this layout is then linearly reduced in size, that is to say shrunk, to a smaller structure width of the production process.

The decoder 110 has eight decoder elements 111, . . . , 118. Each of the decoder elements 111, . . . , 118 has one output, each supplied to one of the memory banks 00, . . . , 07. One of the memory banks 00, . . . , 07 can in each case be activated via these outputs from the memory bank decoder 110. Four address signals are required to select one of the 16 memory banks 00, . . . , 15. To do this, the decoders 110, 120 are supplied with three address signals ADR0, ADR1 and ADR2, which are tapped off from the address bus 60. Furthermore, the bank decoder 110 is supplied with an enable signal EN1, and the bank decoder 120 with an enable signal EN2.

The two enable signals EN1, EN2 are mutually complementary signals. They are produced in the predecoder element 51. A further predecoder element 52 produces corresponding enable signals for the block 2. The predecoder 51 assigned to the block 1 receives two address signals ADR3, ADR4 on the input side, which are tapped off from the address bus 60. Furthermore, the predecoder 51 is supplied with the external enable signal EN. The predecoder 51 uses the signals EN, ADR3 and ADR4 to produce the mutually complementary enable signals EN1, EN2 via respective logic circuit elements. The predecoder 51 has AND gates 511 and 512 for this purpose, to which the external enable signal EN is supplied. An inverter 513 is used to supply the address signal ADR3 in complementary form to the gates 511, 512.

Inside the bank decoder 110, the signals ADR0, ADR1, ADR2, EN1 are supplied simultaneously in each case to the decoder elements 111, . . . , 118. Each of the decoder elements 111, . . . , 118 is activated by a different combination of its input signals, and produces the actuation signal for the respectively associated memory bank. The decoder elements of the bank decoder 120 are likewise supplied with the address signals ADR0, ADR1, ADR2. In contrast to the bank decoder 110, the bank decoder 120 is supplied with the enable signal EN2, which is complementary to the enable signal EN1. The address signals ADR0, ADR1, ADR2 are used to select a respective output signal from the bank decoders 110, 120; the complementary enable signals EN1, EN2 are used for switching between the bank decoders 110, 120.

The memory banks in the block 2 are actuated independently of the memory banks in the block 1. For this purpose, the respective bank decoders are supplied with the same address signals ADR0, ADR1, ADR2, but with different enable signals EN3, EN4. The enable signal EN3 is supplied to the bank decoder 220 in block 2 and the enable signal EN4 is supplied to the bank decoder 210 in block 2. The enable signals EN3 and EN4 are produced by the predecoder 52 associated with the block 2. The further address signal ADR4 tapped off from the address bus 60 is processed in a complementary manner in the predecoders for switching. For this purpose, the address signal ADR4 is supplied directly to the gates 521, 522 in the predecoder 52, and inverted via an inverter 514 to the gates 511, 512 in the decoder 51.

Figure 2:
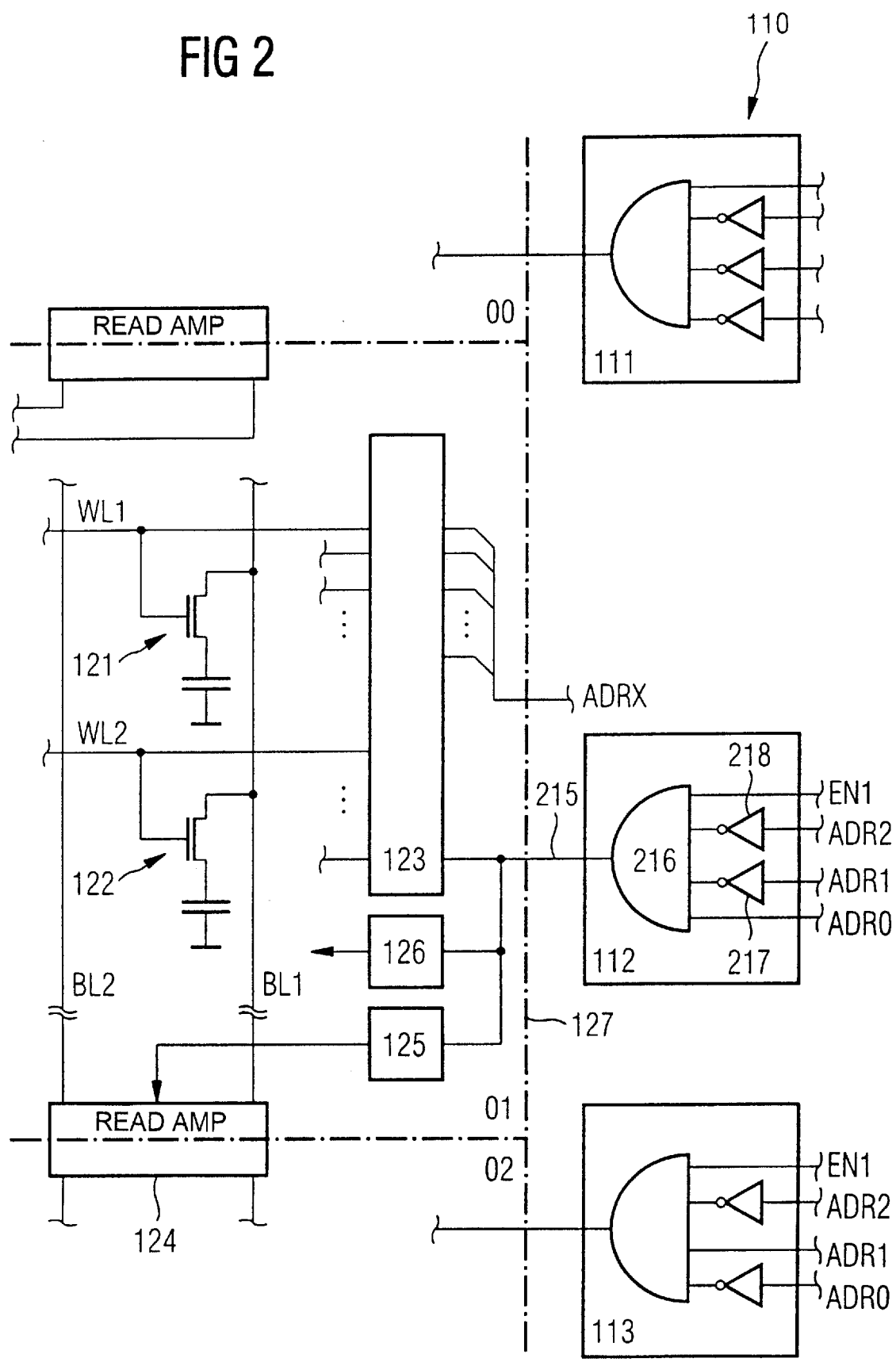
FIG. 2 is a diagrammatic view of a more detailed segment of a memory bank.

Referring now to FIG. 2, there is shown the memory bank 01 and the relevant section of the bank decoder 110 in detail. The memory bank 01 contains a large number of memory cells that are arranged in a matrix. Only the memory cells 121, 122 of the matrix are shown. Each memory cell comprises a memory capacitor and an access transistor. The memory cell is accessed by switching on the access transistor. A respective word line WL1, WL2 is used for this purpose. The word lines WL1, WL2 are arranged in rows, and are activated and deactivated by a row address decoder 123. The memory cells are connected in columns to a bit line BL1, via the line path of the respective access transistor. A read amplifier 124 connected to the bit line BLi and to an adjacent bit line BL2 is used to amplify the information read from a memory cell. One of the memory cells is selected by activating the respective word line to which the memory cell is connected, and the read amplifier which is connected to the respective bit line. Memory cells which are assigned to a column are in each case connected to one bit line, and memory cells which are assigned to a row are in each case connected to one word line. For space reasons, it is expedient for memory banks which are arranged immediately adjacent to one another, for example memory banks 01 and 02, to use the read amplifiers, for example 124, jointly. A memory bank is wherein only one word line and thus only one memory word can be addressed via the row address decoder.

The memory bank 01 is activated by the output 215 of the decoder element 112 of the memory bank decoder 110. This means that the output 215 of the decoder element 112 switches the functional units of the memory bank 01 to be active and to be inactive, for example the row address decoder 123, the read amplifier 124, a timing control circuit 125 for controlling the read amplifiers as a function of the row addressing, and a redundancy decoder 126 by means of which defective memory cells in the memory bank 01 are replaced by redundant cells. The decoder element 112 in the memory bank decoder 110 is designed such that the output 115 is activated only for a specific combination of its input signals EN1, ADR0, ADR1, ADR2. The decoder element 112 is activated for the combination EN1=1, ADR0=1, ADR1=0 and ADR2=0. To this end, the decoder element 112 has an AND gate 216 as well as two inverters 217 (for ADR1) and 218 (for ADR2). The address inputs of the row decoder 123 have remaining address signals ADRX applied to them which are not used for memory bank decoding (such as ADR0, . . . , ADR4) and are not used for column address decoding. The address signals ADRX are likewise supplied to the row decoders, which correspond to the row decoder 123, for the other memory banks.

The block 1 in the present exemplary embodiment comprises 16 ($2^4$) memory banks. The 16 memory banks are subdivided into 2 ($2^1$) groups (01, . . . , 07; 08, . . . , 15). Each group is assigned a memory bank decoder 110 or 120. Each memory bank decoder is supplied with three address signals (ADR0, ADR1, ADR2). Each of the memory bank decoders comprises eight ($2^3$) memory bank decoder elements (111, . . . , 118). Each of the decoder elements is activated whenever a specific one of the eight possible state combinations of the address signals ADR0, ADR1, ADR2 is present. The leading addressing bits of an address which is present on the address bus and selects a memory word indicate the respective bank in which the memory word is located. The other address bits identify the memory word inside the respective bank. While the address area for addressable memory words in different memory banks differs in terms of the leading address bits, the other address bits are in each case the same.

The predecoders 51, 52 are located centrally between the blocks 1, 2. Furthermore, the connecting pads 61, . . . , 66 for entering addresses and an access time control signal are arranged between the blocks 1, 2.

We claim:

1. A semiconductor memory, comprising:
a plurality of memory banks divisible into a first group of memory banks and a second group of memory banks, each of said memory banks including
a memory cell field in which a multiplicity of memory cells are arranged in a matrix;
an address decoder connected to said memory cells for selecting a row in the matrix of memory cells;
input devices for supplying an address with a number of address bits and defining a selection of a respective row in one of said memory cells by actuating said address decoder;
a first memory bank decoder having an input side connected to receive a first portion of the address bits and a first enable signal, and an output side connected to said first group of memory banks, said first memory bank decoder outputting a respective bank selection signal for each said memory bank in said first group, for selecting one of said memory banks in said first group;
a second memory bank decoder constructed substantially identically to said first memory bank decoder and connected to said second group of memory banks, said second memory bank decoder having an input side connected to receive the first portion of the address bits and a second enable signal, and an output side outputting a respective bank selection signal for each said memory bank in said second group, for selecting on of said memory banks in said second group; and
a predecoder having a logic circuit, an input side connected to receive a second portion of the address bits and a further enable signal, and an output side outputting the first and second enable signals as mutually complementary signals.

2. The semiconductor memory according to claim 1, wherein said memory bank decoders each include a memory bank decoder element for each associated memory bank, each said memory bank decoder element having an input side connected to receive the first portion of the address bits and the respective enable signal.

3. The semiconductor memory according to claim 1, wherein said predecoder includes logic gate elements each having an output outputting the complementary enable signals, and an input connected to receive the further enable signal and complementary signals of the second portion of the address bits.

4. The semiconductor memory according to claim 1, wherein said memory banks are activatable and deactivatable by the bank selection signal output by said address decoders.

5. The semiconductor memory according to claim 1, wherein said address decoders are connected to receive a third portion of the address bits, and the address bits in the third portion of the address bits are identical for all said memory banks.

6. The semiconductor memory according to 2, wherein said plurality of memory banks are $2^m$ different memory banks, the first portion of the address bits has n different address bits, the second portion of the address bits has m−n different address bits, said first and second memory bank decoders are included in a number $2^{m-n}$ of memory bank decoders each having $2^n$ memory bank decoder elements, an output signal of a respective said memory bank decoder element of one of said memory bank decoders is activated when one specific combination of $2^n$ possible combinations of states of the address bits input to the respective said memory bank decoder occurs, each of said memory bank decoder elements in a given said memory bank decoder is activatable by a different combination, and m and n are integers.

7. The semiconductor memory according to claim 1, wherein said memory banks associated with one of said first and second memory bank decoders are disposed immediately adjacent one another.

* * * * *